(12) United States Patent
Figov et al.

(10) Patent No.: US 6,352,816 B1
(45) Date of Patent: Mar. 5, 2002

(54) PRINTING AND PCB MEMBERS AND METHODS FOR PRODUCING SAME

(75) Inventors: Murray Figov; Serge Steinblatt, both of Ra'anana; Narda Ben-Horin, Tel Aviv, all of (IL)

(73) Assignee: CreoScitex Corporation Ltd., Herzlia (IL)

( * ) Notice: Subject to any disclaimer, the term of this patent is extended or adjusted under 35 U.S.C. 154(b) by 0 days.

(21) Appl. No.: 09/229,706

(22) Filed: Jan. 13, 1999

(30) Foreign Application Priority Data

Jan. 13, 1998 (IL) .................................................. 122930

(51) Int. Cl.[7] .................................................. G03F 7/00
(52) U.S. Cl. ...................... 430/309; 430/300; 430/306; 430/329; 430/325; 101/457
(58) Field of Search .................... 430/300, 309, 430/320, 322, 325, 326, 329, 294, 270.1, 281.1, 286.1, 905, 284.1; 101/453, 463.1, 130, 454

(56) References Cited

U.S. PATENT DOCUMENTS

| | | | |
|---|---|---|---|
| 5,130,290 A | * 7/1992 | Tanimoto | 503/201 |
| 5,262,275 A | * 11/1993 | Fan | 430/273 |
| 5,719,009 A | * 2/1998 | Fan | 430/306 |
| 5,919,600 A | * 7/1999 | Huang et al. | 430/272.1 |
| 5,925,500 A | * 7/1999 | Yang et al. | 430/300 |
| 5,994,032 A | * 11/1999 | Goffing et al. | 430/307 |
| 6,020,108 A | * 2/2000 | Goffing et al. | 430/306 |
| 6,037,102 A | * 3/2000 | Loerzer et al. | 430/306 |
| 6,120,948 A | * 9/2000 | Ishihara | 430/14 |
| 6,143,470 A | * 11/2000 | Nguyen et al. | 430/273.1 |
| 6,152,036 A | * 11/2000 | Vertschueren et al. | 101/457 |
| 6,182,570 B1 | * 2/2001 | Rorke et al. | 101/462 |
| 6,192,798 B1 | * 2/2001 | Rorke et al. | 101/457 |
| 6,248,503 B1 | * 6/2001 | Vermeersch et al. | 430/302 |

FOREIGN PATENT DOCUMENTS

| | | |
|---|---|---|
| DE | 195 36 805 A1 | 4/1997 |
| DE | 195 36 806 A1 | 4/1997 |
| EP | 0 678 380 B1 | 10/1995 |
| EP | 0 741 330 B1 | 11/1996 |
| JP | 359211044 | * 11/1984 |
| WO | WO 96 16356 | 5/1996 |
| WO | WO 97 00777 | 1/1997 |

* cited by examiner

*Primary Examiner*—Janet Baxter
*Assistant Examiner*—Yvette M. Clarke
(74) *Attorney, Agent, or Firm*—Eitan, Pearl, Latzer & Cohen-Zedek (57) ABSTRACT

Printing and printed circuit board members and a method for producing printing member from a member is provided. The printing member includes a topmost protective layer, an IR ablatable layer, a substrate and a wash-off layer. The wash-off layer is washed with a solvent after imagewise ablation of the topmost protective layer so as to expose the substrate, so that the printing member is produced. In one embodiment, the IR ablatable layer is disposed above the topmost protective layer and the wash-off layer is intermediate the topmost protective layer and the substrate

6 Claims, 5 Drawing Sheets

PRINTING AND PCB MEMBERS AND METHODS FOR PRODUCING SAME

FIELD OF THE INVENTION

The present invention relates to printing members useable in a variety of printing presses, such as, gravure, offset, silk screen, flexo and others and to methods for producing same. The term printing members refers throughout the specification and claims to printing members used in printing presses operating with an inking fluid. The invention also applies to printed circuit board (PCB) members.

BACKGROUND OF THE INVENTION

There are two types of printing members typically used in state of the art printing presses, such as gravure, offset screen and flexo printing presses and described in FIGS. 1A through 2B. The printing member of FIG. 1A, generally referenced 10, comprises a base layer 2 and a Ultra Violet (UV) curable layer 4. The member 10 is being recorded by applying a mask 6, as also indicated by step 12 (FIG. 1B). The member is being flood exposed to UV light, the mask blocks the UV light from certain parts of the member, the exposed parts 8 are polymerized (step 14 of FIG. 1B), the mask is then being removed (step 16 in FIG. 1B) and the member 10 is being cleaned so that non exposed areas 7 are removed by washing (step 18 in FIG. 1).

Figure 1A:
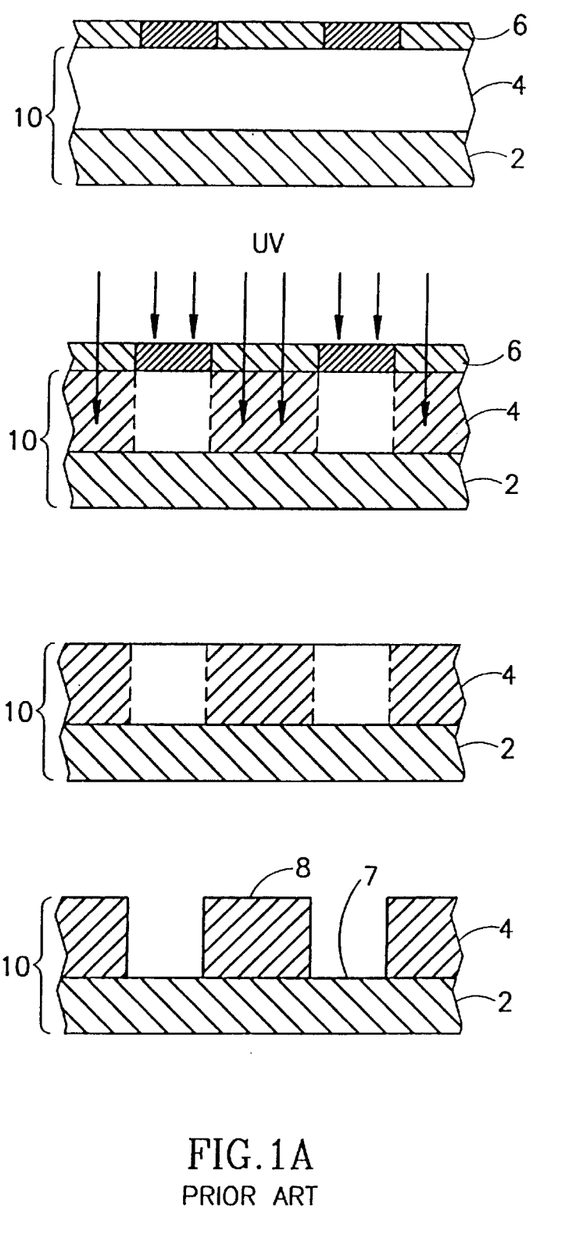
FIGS. 1A and 1B are schematic cross sectional and block diagram illustrations, respectively, of a prior art method for producing printing members suitable for use in a printing press.
Figure 1B:
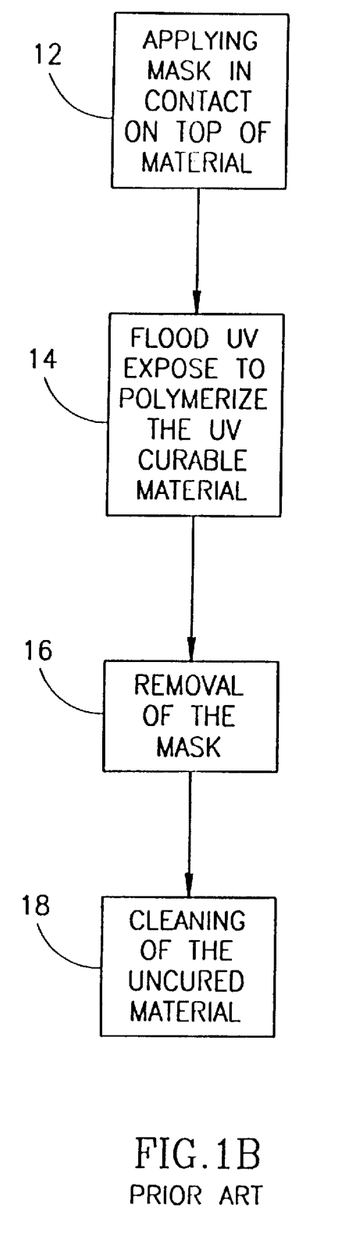
Figure 2A:
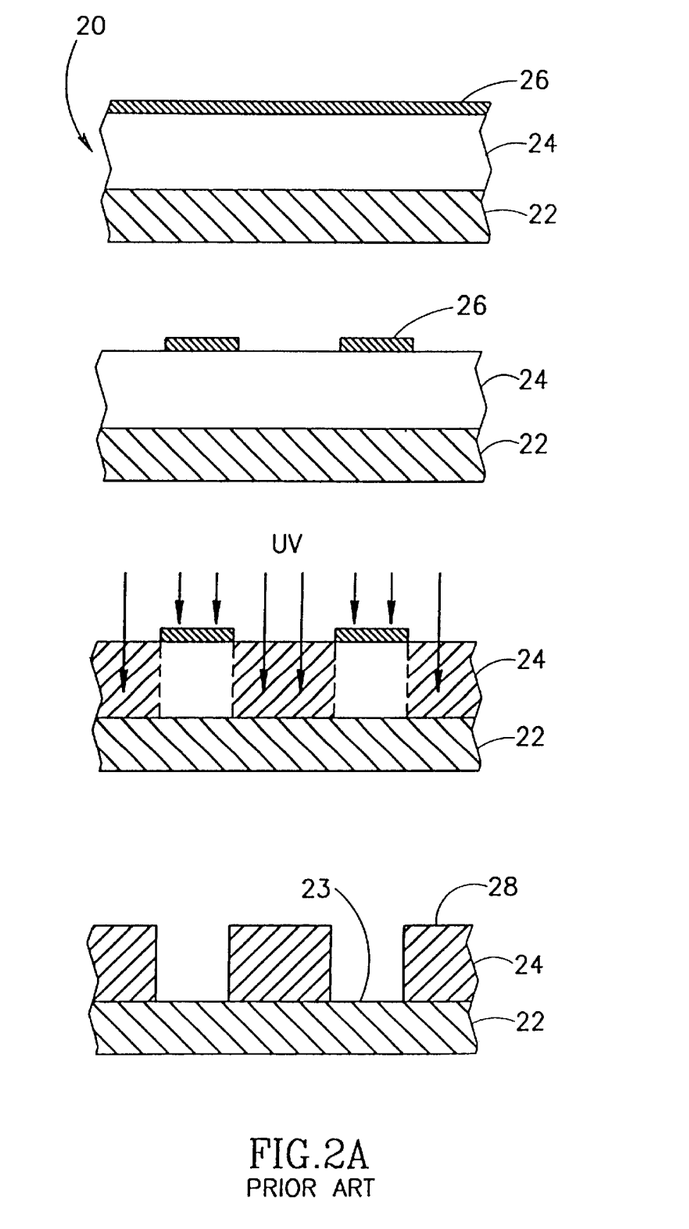
FIGS. 2A and 2B are schematic cross sectional and block diagram illustrations, respectively, of another prior art method for producing printing members suitable for use in a printing press.
Figure 2B:
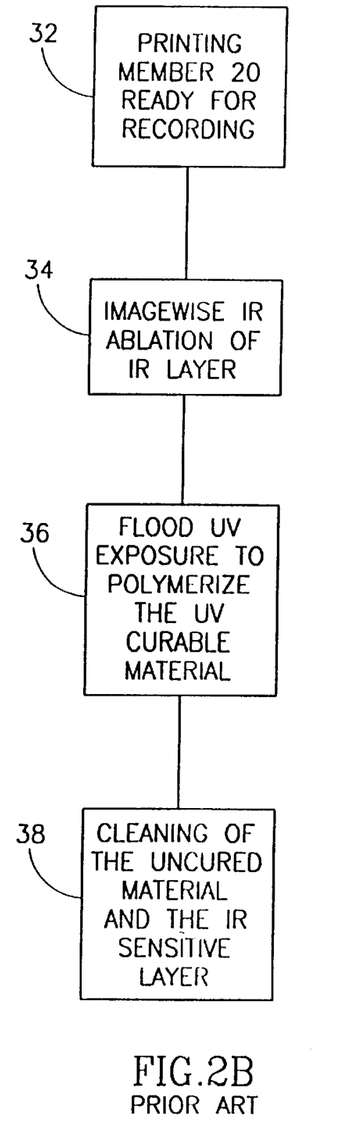

In the Example of FIG. 2A, the mask forms part of the printing member 20. The member 20 comprises a base layer 22 and a UV curable layer 24 witch may be similar to layers 2 and 4 (FIG. 1A). The layer 24 is being coated with an Infra Red (IR) absorbable UV blocking material 26 (see also 32 in FIG. 2B which represents the member 20 ready for recording), the image is being ablated in a digital pixel by pixel fashion (step 34 of FIG. 2B) and subsequently the entire member is flood exposed to UV light (step 36 of FIG. 2B) which hardens (polymerizes) the areas 28 from which the coating 26 has been removed. The unexposed areas 23 are removed by cleaning thus providing the printing member 20.

Figure 3A:
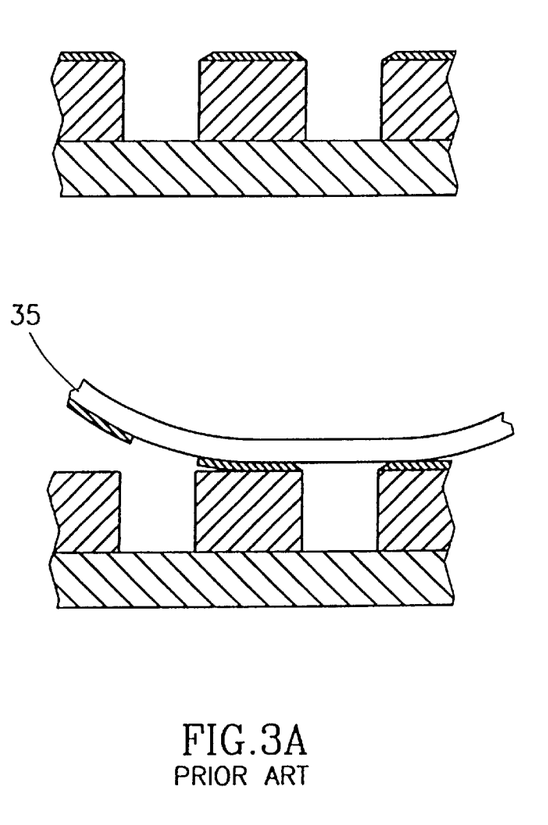
FIGS. 3A and 3B are schematic cross sectional and block diagram illustrations, respectively, of the printing process with the printing member of FIGS. 1A and 2A.
Figure 3B:
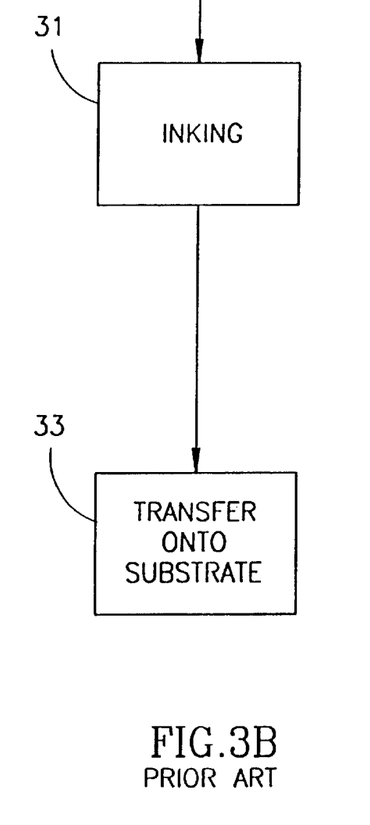

During printing with both printing members 10 and 20 ink is first applied to the printing member (step 31 of FIG. 3B) and then transferred to the substrate 35 (FIG. 3A) as also indicated in step 33.

These types of printing members are also used not as printing members but as Printed Circuit Boards (PCB) members with the addition of a conductive layer. These two types of members are collectively referred to hereinafter as member or members.

SUMMARY OF THE INVENTION

The present invention provides a printing or PCB member. In on preferred embodiment, the member includes a topmost protective layer, an IR ablatable layer disposed above the topmost protective layer, a substrate and a washoff layer intermediate the topmost protective layer and the substrate. The wash-off layer is washed with a solvent after imagewise ablation of the topmost protective layer so as to expose the substrate, so that a printing member is produced.

In another preferred embodiment, the IR ablatable layer is disposed below the topmost protective layer.

In yet another preferred embodiment of the present invention, the topmost protective layer and the IR ablatable layer are combined in one layer.

Further, in accordance with a preferred embodiment of the present invention, the IR ablatable layer includes a resinous binder combined with an Infra Red absorbing dye or pigment or resins such as acrylics or polyurethanes with carbon black dispersed in resin or nigrosine dissolved in the resinous solution before deposition.

Still further, in accordance with a preferred embodiment of the present invention, the thickness of the IR ablatable layer is generally between 0.01 and 5 microns.

Additionally, in accordance with a preferred embodiment of the present invention, the protective layer includes a binder resin which is insoluble in the solvent used for wash out either by its nature or by reason of the cross-linking of the resin during the deposition of the layer or a sheet of polymer or the protective layer has been derived from a cross-linkable water soluble melamine derivative plus a suitable cross-linking material such as toluene sulphonic acid, or an aqueous dispersion of polyurethane, cross-linked with a suitable cross-linking material.

Still further, in accordance with a preferred embodiment of the present invention, the thickness of the protective layer is generally between 0.2 and 5 microns.

Moreover, in accordance with a preferred embodiment of the present invention, the combined layer includes a polysiloxane resin loaded with an Infra Red absorbing dye or pigment.

There is also provided in accordance with a preferred embodiment of the present invention a printing member wherein the washoff layer comprises UV curable materials and includes an alkali soluble rosin maleic resin esterified with pentaerythritol, an acrylate oligomer, a monomer-acrylate or methacrylate and a photoinitiator such as hydroxymethyl phenylpropane.

Still further, in accordance with a preferred embodiment of the present invention, the thickness of the washoff layer is generally between 0.2 microns and 5 mm.

Further, in accordance with a preferred embodiment of the present invention, the substrate is selected from the group of polyester, aluminum, anodized aluminum or copper cladded glass/epoxy resin.

There is also provided in accordance with a preferred embodiment of the present invention a printing member wherein the member is a gravure printing member and wherein the thickness of the IR ablatable layer is generally between 0.01 to 5 microns, the thickness of the protective layer is generally between 0.2 to 5 microns, the thickness of the wash-off layer is generally between 30–200 microns, and the thickness of the substrate is between 100–3,000 microns.

There is also provided in accordance with a preferred embodiment of the present invention a printing member wherein the member is an offset printing member and wherein the thickness of the IR ablatable layer is generally between 0.1 to 5 microns, the thickness of the protective layer is generally between 0.2 to 5 micron, the thickness of the wash-off layer is generally between 0.1 to 1 micron, and the thickness of the substrate is between 150–800 microns.

Additionally, in accordance with a preferred embodiment of the present invention, there is provided a printing member wherein the member is a screen printing member, the substrate being a screen of woven polyester, cellulose fiber, nylon or stainless steel.

Still further, in accordance with a preferred embodiment of the present invention, there is provided a screen printing member wherein the thickness of the IR ablatable layer is generally between 0.1 to 5 microns, the thickness of the protective layer is generally between 0.2 to 5 micron, the thickness of the wash-off layer is generally between 0.1 to 5 micron, and the thickness of the substrate is between 50–300 microns, and wherein the wash off layer is within the material of screen or a screen printing wherein the thickness of the IR ablatable layer is generally between 0.01 to 5 microns, the thickness of the protective layer is generally between 0.2 to 5 micron and the thickness of the wash-off layer is generally between 0.1 to 5 microns.

There is also provided in accordance with a preferred embodiment of the present invention a printing member wherein the member is a printed circuit board member or a flexo printing member.

Methods for producing the members of the present invention are also disclosed, in a preferred embodiment, the method includes the step of providing the member of the present invention, exposing it to imagewise IR radiation so as to ablate the IR absorbing layer and the protective layer and washing off the washoff layer so as to expose the substrate whereby the member ready to be used as a PCB or a printing member is ready for use.

Further, in accordance with a preferred embodiment of the present invention, the step of washing further including the step of mechanically removing the wash-off layer.

Moreover, in accordance with a preferred embodiment of the present invention, the method also includes the step of UV curing the member after said step of washing.

Still further, in accordance with a preferred embodiment of the present invention, the member also includes a conductive layer and the method further includes the step of etching the electrically conductive layer after the step of washing.

Furthermore, in accordance with a preferred embodiment of the present invention, the method further comprises the step of a second washing after the step of etching.

BRIEF DESCRIPTION OF THE DRAWINGS

The invention is herein described, by way of example only, with reference to the accompanying drawings, wherein.

DETAILED DESCRIPTION OF THE INVENTION

Figures 4A, 4B:
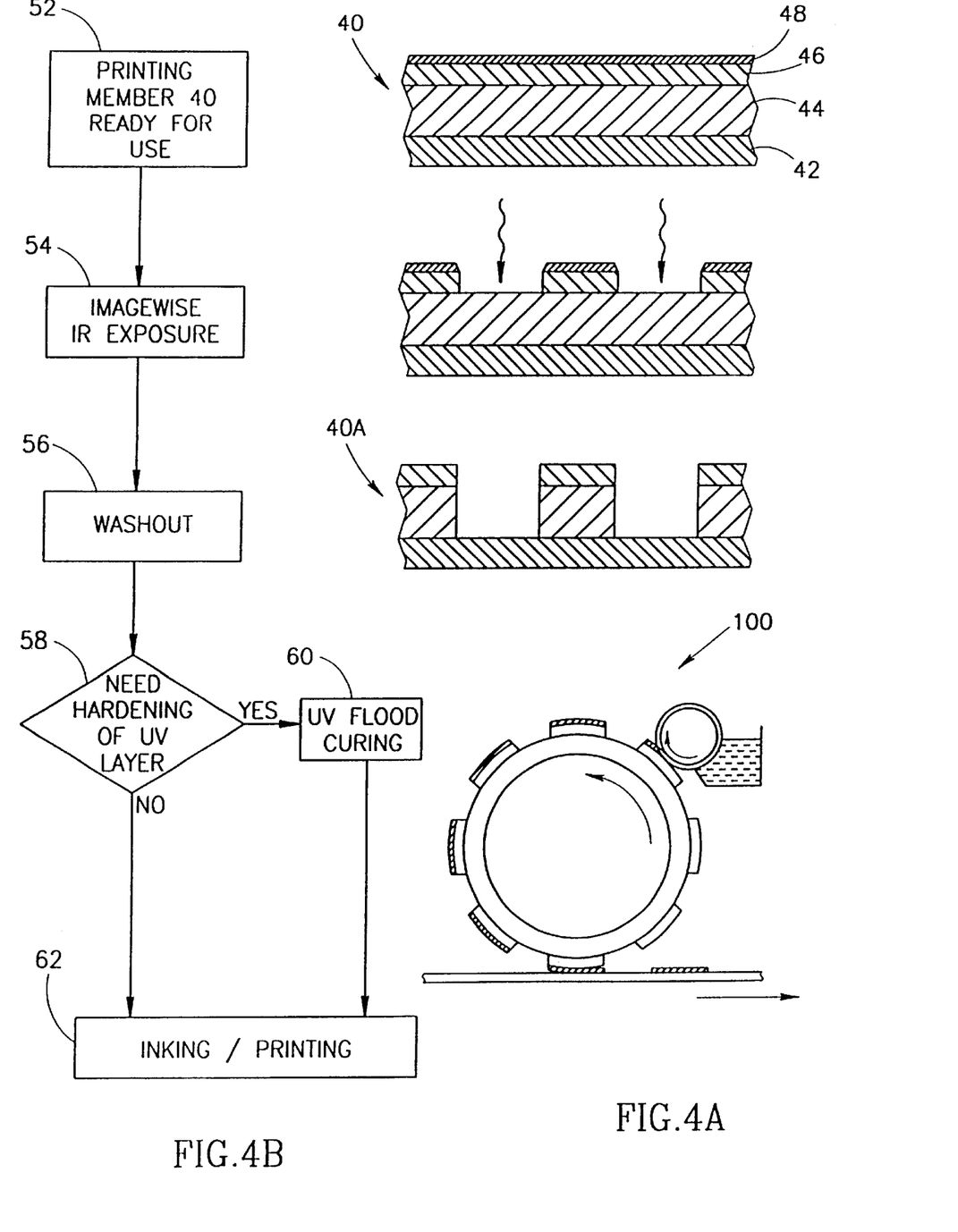
FIGS. 4A and 4B are schematic cross sectional and block diagram illustrations, respectively, of a method for producing printing members suitable for use in a printing press according to the present invention.

Reference is now made to FIGS. 4A and 4B which illustrate the printing member of the present invention and the preferred method for producing same. The printing member of FIG. 4A, generally referenced 40, comprises a topmost protective layer which includes an IR ablatable material, a substrate and a wash-off layer intermediate the topmost protective layer and the substrate. The wash-off layer is washed with a solvent after imagewise ablation of the topmost protective layer so as to expose the substrate, so that the printing member is produced ready for printing.

In a preferred embodiment, printing member 40 comprises a base layer 42, a washable layer 44, a protective layer 46 and an IR ablatable layer 48.

The base layer 42 may be any suitable substrate, such as polyester, polymide, aluminum, anodized aluminum, screen, such as a woven polyester, stainless steel or cellulose screens, or copper cladded glass/epoxy resin. The base layer 42 is similar to the base layer of printing members 10 and 20 (FIGS. 1A and 1B) as prepared for printing.

The washable layer 44 may be similar to the UV curable layers 4 and 24 of the prior art printing members 10 and 20, or for the PCB application it may be a washable non UV curable layer.

In a preferred embodiment, the wash-off layer comprises UV curable materials and includes an alkali soluble rosin maleic resin esterified with pentaerythritol, an acrylate oligomer, a monomer-acrylate or methacrylate and a photoinitiator such as hydroxymethyl phenylpropane. Preferably, the thickness of said wash-off layer is generally between 0.2 microns and 5 mm.

Unlike the prior art members 10 and 20, printing member 40 also includes a protective layer 46 which protects the layer 44 during washing as described in detail hereinbelow with reference to FIG. 4B.

The protective layer 46 preferably comprises a binder resin which is insoluble in the solvent used for wash out, either by its nature or by reason of the cross-linking of the resin during the deposition of the layer or a sheet of polymer. The protective layer may be derived from a cross-linkable water soluble melamine derivative and a suitable cross-linking material such as toluene sulphonic acid, or an aqueous dispersion of polyurethane, cross-linked with a suitable cross-linking material. The thickness of the protective layer is generally between 0.2 and 5 microns.

Printing member 40 also includes an IR ablatable layer 48 which may be similar to IR ablatable layer 26 (FIG. 2A). The protective layer 46 and the IR ablatable layer 48 may be reversed so that the protective layer 46 is uppermost and on top of the IR ablatable layer 48, or may be combined as one layer performing both functions.

In one preferred embodiment of the present invention, the combined layer may include a polysiloxane resin which is loaded with an Infra Red absorbing dye or pigment. Such a material, after imaging and development, provides a surface with a very low surface energy.

It will be appreciated that unlike in prior art gravure processes, when the imaged member as described is used for printing, the gravure type ink is easily wiped clean from the silicone surface without the need of a rigid knife blade, thus reducing wear to minimum.

In one preferred embodiment, the plate may be kept clean with a plastic blade covered with an absorbent material held on the surface with light pressure.

The IR ablatable layer preferably comprises a resinous binder combined with an Infra-red absorbing dye or pigment. The resin may be an acrylic or a polyurethane with carbon black dispersed in the resin or nigrosine dissolved in the resinous solution before deposition. The thickness of the IR ablatable layer 48 is generally between 0.01 and 5 microns.

FIG. 4B describes the method of the present invention for recording a latent image on printing member 40. Block 52 represents the member 40 ready for recording. In step 54, printing member 40 is being exposed to imagewise IR laser radiation, for example to pixel by pixel digital information, which ablates both the IR ablatable layer 48 and the protective layer 46. In the non limiting experiments described hereinbelow a Lotem plate setter, commercially available from Scitex Corporation Ltd. of Herzlia, Israel, has been used.

In step 56 the washable UV curable layer 44 is being washed by any suitable washing method, such as with water or dilute alkaline or dilute acid or solvent mixtures as known in the art. In the non-limiting experiments described below dilute alkali has been used (Sodium hydroxide dissolved in water). Optionally, mechanical cleaning can be used to assist the chemical washing or to replace it.

It will be appreciated that unlike in prior art recording methods, the washing step of the method of the present invention precedes the UV curing step. Thus, the IR ablatable layer of the present invention does not have to be a UV blocking layer as in the case of the prior art recording member 20.

Once washed, member 40 may be subjected to UV curing or to printing, depending on the application for which member 40 is used.

Printing member 40 may or may not require UV curing after washing as indicated by step 58. For printing applications which require mechanical resistivity of the printing member and resistance to solvents in the printing ink, such as offset, the printing member 40 may be UV cured as indicated by step 60. The printing member 40, now shown as printing member 40A (with or without UV curing) may be used for printing by printing apparatus 100 as indicated by step 62.

The following examples illustrate non limiting examples of the printing members of the present invention. In all examples, mixture 1 represents the layer 44, mixture 2 represent the protective layer 46 and mixture 3 represent the IR absorbing layer 48.

EXAMPLES FOR IR WASH-OFF PATENT

Example 1—Gravure Printing Plate

The following mixture was prepared (all parts by weight);

| MIXTURE 1 | |
|---|---|
| Alsynol RC 12 | 15.6 parts |
| Ebecryl 1259 | 8.2 |
| Irgacure 184 | 0.48 |
| Ethyl Acetate | 15 |
| Butyl Acetate | 3 |
| Ethyl Alcohol | 15 |
| Rose Bengal | 0.09 |

The mixture was stirred until everything was dissolved to give a clear solution. The mixture was coated onto 175 micron polyester with a bar coater and dried in an oven for 2 minutes at 120° C. The resulting dry film was measured as 50 microns thick.

The following mixture was then made up;

| MIXTURE 2 | |
|---|---|
| Cymel 373 | 24 parts |
| Deionised water | 46 |
| Cycat 4040 | 1 part |

This was bar coated on top of the previous coating and dried at 140° C. for 4 minutes to a dry coating weight of 1 gram per square meter.

The following mixture was made up;

| MIXTURE 3 | |
|---|---|
| Microlith Black C-WA | 100 parts |
| Isopropanol | 100 parts |

The mixture was then bar coated on top of the previous coating to a dry coating weight of 1 gram per square meter measured after drying at 140° C. for 4 minutes.

The finished plate was then mounted on a machine as described and imaged with an Infra Red laser array as described.

After imaging the surface of the plate was rubbed with a solution of 0.2 parts of sodium hydroxide dissolved in 31 parts of deionised water. Where there were ablated image areas, the pink first coat was removed, leaving colorless polyester film. The etch solution also removed the black surface layer but left the barrier second layer.

The plate was then exposed to UV radiation to produce a hard gravure plate with holes corresponding to image areas.

The plate was printed by applying gravure ink and wiping with a blade and then impressing paper onto the plate.

Hereinbelow, a list of industrial sources of materials mentioned in the example;

| | |
|---|---|
| Alsynol RC 12 | Rosin-maleic resin, esterified with pentaerythritol DSM Resins 3150 AA Hoek van Holland |
| Ebecryl 1259 | Aliphatic trifunctional urethane acrylate/methacrylate diluted with 35% HPMA (Hydroxypropyl methacrylate) UCB Chemicals, Anderlecht St. 33 - B-1620 Drogenbos - Belgium |
| Irgacure 184 | 1-hydroxy-cyclohexyl-phenyl-ketonel CIBA-Geigy, Corp., CH-4002, Basle, Switzerland. |
| Cymel 373 | methoxymethyl methylol melamine in water (85% solution) - Dyno-Cytec, Botleweg 175, 3197 KA Rotterdam, The Netherlands. |

| -continued | |
|---|---|
| Cycat 4040 | Toluene sulphonic acid cross-linking solution Dyno-Cytec, Botleweg 175, 3197 KA Rotterdam, The Netherlands. |
| Microlith Black C-WA | Aqueous dispersion of carbon black with acrylic resin. CIBA-Geigy, Corp, CH-4002, Basle, Switzerland. |

Example 2

The following mixture was prepared;

| MIXTURE 1 | |
|---|---|
| Ethyl Alcohol | 200 parts |
| Rose Bengal | 0.36 parts |
| Isopropanol | 380 parts |
| Ebecryl 1259 | 200 parts |
| Irgacure 184 | 1.7 parts |
| BYK 307 | 1 part |
| Poly Methyl vinyl ether-alt-maleic acid monolisopropyl ester | 2 parts |

The mixture was stirred until everything was dissolved to give a clear solution. The mixture was filtered to remove any extraneous matter and then coated onto 175 micron polyester with a Mayer rod. The coating was left to air dry for half a minute, followed by oven drying for 2 minutes at 120° C. The resulting film was measured as 40 microns thick.

The following mixture was then made up;

| MIXTURE 2. | |
|---|---|
| Dehesive 410E | 135 parts |
| CAB-O-JET 200 | 45 |
| Q2-5211 Super Wetting agent | 6 |
| Cymel 373 | 21 |
| Cycat 4045 | 5.7 |
| Crosslinker V72 | 30 |

Each ingredient of the mixture was added in the order as shown, and the complete mixture was then bar coated on top of the previous coating and dried at 140° C. for 4 minutes to a dry coating weight of 2 microns.

The finished plate was then mounted on a machine as described previously, and imaged with an Infra Red laser array as described.

After imaging, the surface of the plate was treated with the following mixture;

| MIXTURE 3 | |
|---|---|
| Deionised water | 99 parts |
| Sodium carbonate | 0.2 |
| Benzyl alcohol | 0.4 |
| Sodium dodecyl laurate | 0.2 |

After 30 seconds, the surface was washed, dried and exposed to UV radiation to produce a gravure plate. The plate was printed by applying gravure ink and wiping it gently with a plastic blade and then impressing paper onto the plate.

The following list shows industrial sources of new materials mentioned in the example;

| | |
|---|---|
| BYK 307 | BYK Chemie, Wesel, Germany |
| Poly Methyl vinyl ether-alt-maleic acid monoisopropyl ester | Aldrich Chemical Co., Milwaukee, Wisconsin, U.S.A. |
| Dehesive 410E | Wacker Chemie GmbH, Munich, Germany |
| CAB-O-JET 200 | Cabot Corporation, Billerca, Massachuetts, Us |
| Q2-5211 Super Wetting Agent | Dow Corporation, Midland, MI, USA. |
| Cymel 373 | Dyno-Cytec |
| Cycat 4045 | Amine blocked P-toluene sulphonic acid, (Dyno-cytec) |
| Crosslinker V72 | Wacker |

Example 3—Offset Litho Plate

Mixture 1 was wire - rod coated onto 200 micron anodized aluminum to a dry-weight thickness of 1 gram per square centimeter and dried at 120° C. for 1 minute.

Mixtures 2 and 3 were then coated onto the surface of the coated plate exactly as described above and the resulting plate imaged and processed as previously described. After processing, the areas where the laser had affected the coating and where the coating had been subsequently cleaned off as described are left with exposed anodized aluminum which is hydrophilic and provide the back-ground of the printing plate. The Mixture 2 surface that remains is oleophilic and provides the image areas of the printing plate.

Example 4—Screen Printing

Mixture 1 was coated onto a polythene - coated release paper to a dry weight of 30 grams per square meter. The coating was left to air dry for 1 minute and then a polyester mesh screen was laid on top of it and smoothed down with a rubber roller. The composite was then dried in the oven for 2 minutes at 120° C. and then treated and imaged as described previously. The resulting product was a screen resistant to a large range of solvents after UV curing, and therefore able to be used with a large variety of inks.

In one preferred embodiment, the printing member 40 is a gravure printing member, the thickness of its IR ablatable layer is generally between 0.01 to 5 microns, the thickness of its protective layer is generally between 0.2 to 5 microns, the thickness of the wash-off layer is generally between 30–200 microns, and the thickness of the substrate is between 100–3,000 microns.

In another embodiment, the printing member 40 is an offset printing member, the thickness of the IR ablatable layer is generally between 0.1 to 5 microns, the thickness of the protective layer is generally between 0,2 to 5 micron, the thickness of the wash-off layer is generally between 0.1 to 1 micron, and the thickness of the substrate is between 150–800 microns.

In another embodiment of the present invention, the printing member 40 is a screen printing member, the substrate being a screen of woven polyester, cellulose fiber, nylon or stainless steel. The thickness of the IR ablatable layer is generally between 0.1 to 5 microns, the thickness of the protective layer is generally between 0,2 to 5 micron, the thickness of the wash-off layer is generally between 0.1 to 5 micron, and the thickness of the substrate is between 50–300 micron, and the wash off layer is within the material of screen.

In a further embodiment the printing member 40 is a flexo printing member.

Figures 5A, 5B:
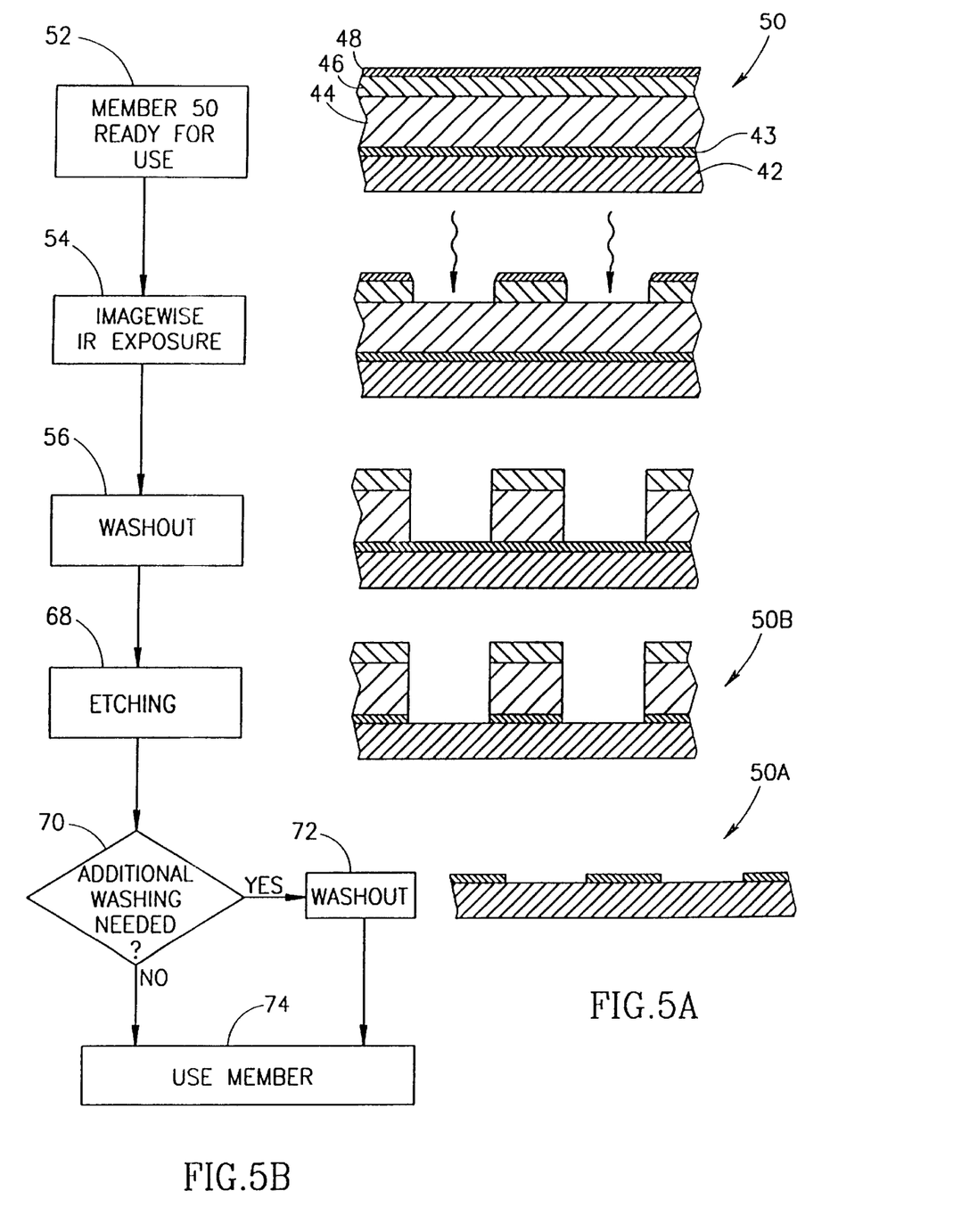
FIGS. 5A and 5B are schematic cross sectional and block diagram illustrations, respectively, of a method for producing members suitable for use as printed circuit boards (PCB) according to the present invention.

Reference is now made to FIGS. 5A and 5B which are schematic cross sectional illustration and block diagram, respectively, of a member, generally referenced 50, and a method for producing a member suitable for use as a printed circuit board according to the present invention. Member 50 is similar to printing member 40 except that it also includes an electrically conductive metal layer 43, an intermediate substrate 42 and a washable layer 44. For PCB manufacturing applications, layer 42 is laminated or coated usually with copper.

As shown in FIG. 5B, steps 52–56 are similar for producing printing members 40 and 50. Member 50 is then etched by any etching method known in the art as indicated by step 68. After etching of layer 43, member 50 may require additional washing (step 70) to remove the portions of washable layer 44 and the protective layer 46 which may remain on top of the copper layer. If such washing is required then these layers are being so washed (step 72). The resulting member 50A is now ready for use (step 74), for example as a circuit board. Alternatively the etched member 50 is not being washed again (step 72 is omitted) and is used as is, as shown by reference numeral 50B.

A non limiting example for producing member 50 is provided below.

Example 5—Circuit Board Preparation

All coating and treatment are as in Example 1 but with no UV curing. Instead, the material is soaked in a 30% Ferric Chloride.

Example 6

The following mixture was prepared;

| MIXTURE 1 | |
|---|---|
| Cymel 385 | 26.4 parts |
| Deionised water | 98.2 |
| Tegowet KL245 | 2.8 |
| Cycat 4040 | 1.2 |

The above mixture was stirred and then bar coated onto an epoxy copper laminate (18 microns thick copper on 100 microns epoxy). The coating was dried in an oven at 140° C. for 4 minute to a dried coating weight of 2 gram per square meter.

The following mixture was then prepared;

| MIXTURE 2 | |
|---|---|
| Cabojet 200 | 15.9 parts |
| Neorez 972 | 9.9 |
| Tegowet KL245 | 2.0 |
| Water | 9.6 |
| Isopropanol | 9.9 |
| CX-100 Crosslinker | 2.0 |

The mixture was stirred and bar coated onto the previous mixture coating and dried in the oven at 140° C. for 4 minute to a dried coating weight of 1.5 gram per square meter.

The resulting plate was imaged and processed as described in Example 1, but with no UV curing. Instead, the material was soaked in 30% Ferric chloride at 50° C. until the copper in the imaged areas was entirely etched away. The remaining coatings that had been used to protect the copper during etching were then removed by rubbing with methyl ethyl ketone.

The finished plate was then mounted on a machine as described and imaged with an Infra Red laser array as described.

After imaging the surface of the plate was rubbed with a solution of 0.2 parts of sodium hydroxide dissolved in 31 parts of deionised water. Where there were ablated image areas, the pink first coat was removed, leaving colorless polyester film. The etch solution also removed the black surface layer but left the barrier second layer.

The following list shows industrial sources of new materials mentioned in the example;

| | |
|---|---|
| Cymel 385 | Methoxymethyl methylol melamine-Dyno-Cytec |
| Tegowet KL245 | Tego Chemi Service GmbH, Essen, Germany |
| Neorez 972 | Zeneca Corporation, Wilmington, Massachussetts, USA |
| CX-100 Crosslinker | Zeneca |

While the invention has been described with respect to a limited number of embodiments, it will be appreciated that many variations, modifications and other applications of the invention may be made.

What is claimed is:

1. A method for producing a printing member comprising:

providing a precursor printing member comprising:
a protective layer of a material insoluble to a washing solvent and IR ablatable,
a substrate, a wash-off layer intermediate to said protective layer and said substrate, said wash-off layer soluble in said washing solvent, and an IR ablatable layer in contact with said protective layer;
ablating said protective layer and said IR ablatable layer by imagewise IR radiation, so as to expose selected portions of said wash-off layer; and
washing off said selected portions of wash-off layer so as to expose said substrate, whereby said printing member is produced.

2. A method according to claim 1 wherein said step of washing further comprising the step of mechanically removing said wash-off layer.

3. A method according to claim 1 also comprising the step of UV curing said member after said step of washing.

4. A method according to claim 1 wherein said step of providing a precursor additionally includes providing an electrically conductive layer intermediate said substrate and said wash-off layer; and wherein said method further comprises etching said electrically conductive layer after said washing off portions of said wash-off layer.

5. A method according to claim 4 wherein said method further comprises a second washing after said etching.

6. A method according to claim 1 wherein said protective layer and said IR ablatable layer are a single layer.

* * * * *